US012757575B2

(12) United States Patent
Yoon et al.

(10) Patent No.: US 12,757,575 B2
(45) Date of Patent: Oct. 6, 2026

(54) DISPLAY APPARATUS

(71) Applicant: Samsung Display Co., Ltd., Yongin-si (KR)

(72) Inventors: Youngsoo Yoon, Yongin-si (KR); Yanghee Kim, Yongin-si (KR); Hyunchol Bang, Yongin-si (KR); Bongwon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 363 days.

(21) Appl. No.: 18/479,937

(22) Filed: Oct. 3, 2023

(65) Prior Publication Data

US 2024/0121985 A1 Apr. 11, 2024

(30) Foreign Application Priority Data

Oct. 7, 2022 (KR) ........................ 10-2022-0129032

(51) Int. Cl.

*H10K 59/121* (2023.01)
*H10K 59/126* (2023.01)
*H10K 59/131* (2023.01)

(52) U.S. Cl.

CPC ..... *H10K 59/1216* (2023.02); *H10K 59/1213* (2023.02); *H10K 59/126* (2023.02); *H10K 59/131* (2023.02)

(58) Field of Classification Search

CPC ............. H10K 59/1216; H10K 59/121; H10K 59/1213; H10K 59/126; H10K 59/131; H10D 86/60; H10D 86/441; H10D 86/021; H10D 86/48

See application file for complete search history.

(56) References Cited

U.S. PATENT DOCUMENTS 9,786,697 B2 * 10/2017 Lee .................. G02F 1/136213
9,911,379 B2 3/2018 Kim et al.
10,510,302 B2 12/2019 Yoo et al.
(Continued)

FOREIGN PATENT DOCUMENTS

CN 110112193 A 8/2019
KR 10-2015-0025537 A 3/2015
(Continued)

*Primary Examiner* — Nikolay K Yushin

(74) *Attorney, Agent, or Firm* — Womble Bond Dickinson (US) LLP

(57) ABSTRACT

A display apparatus includes a substrate including a sub-pixel area, a first thin-film transistor in the sub-pixel area, and including a first semiconductor layer, and a first gate electrode overlapping the first semiconductor layer with a gate-insulating layer therebetween, and a capacitor in the sub-pixel area, electrically connected to the first thin-film transistor, and including a first electrode including a same material as the first gate electrode, a second electrode overlapping the first electrode with a first inorganic insulating layer therebetween, a third electrode overlapping the second electrode with a second inorganic insulating layer therebetween, and a fourth electrode overlapping the third electrode with an insulating layer therebetween, the insulating layer being above the second inorganic insulating layer and including a first organic insulating layer defining an opening corresponding to the capacitor and filled with an inorganic insulating material.

20 Claims, 10 Drawing Sheets

(56) References Cited

U.S. PATENT DOCUMENTS

| | | | | |
|---|---|---|---|---|
| 11,751,448 | B2 * | 9/2023 | Yoon | G09G 3/3208 361/679.02 |
| 2015/0061983 | A1 | 3/2015 | Kim | |
| 2016/0372497 | A1 * | 12/2016 | Lee | H10D 86/471 |
| 2017/0053975 | A1 | 2/2017 | Cho et al. | |
| 2021/0335954 | A1 | 10/2021 | Son et al. | |
| 2021/0359047 | A1 | 11/2021 | Yoon et al. | |
| 2021/0391407 | A1 * | 12/2021 | Yoon | G06F 1/1686 |

FOREIGN PATENT DOCUMENTS

| | | | |
|---|---|---|---|
| KR | 10-2016-0090949 | A | 8/2016 |
| KR | 10-2017-0023271 | A | 3/2017 |
| KR | 10-2018-0076828 | A | 7/2018 |
| KR | 10-2009748 | B1 | 8/2019 |
| KR | 10-2021-0085748 | A | 7/2021 |
| KR | 10-2021-0130879 | A | 11/2021 |
| KR | 10-2021-0142808 | A | 11/2021 |

* cited by examiner

DISPLAY APPARATUS

CROSS-REFERENCE TO RELATED APPLICATION

This application claims priority to, and the benefit of, Korean Patent Application No. 10-2022-0129032, filed on Oct. 7, 2022, in the Korean Intellectual Property Office, the disclosure of which is incorporated by reference herein in its entirety.

BACKGROUND

1. Field

One or more embodiments relate to a display apparatus.

2. Description of the Related Art

Display apparatuses visually display images. Display apparatuses may be used as displays of small-sized products, such as mobile phones, or large products, such as televisions.

A display apparatus includes a plurality of pixels for emitting light by receiving electrical signals to externally display images. Each pixel includes a light-emitting diode, and for example, an organic light-emitting display apparatus includes an organic light-emitting diode (OLED) as a light-emitting diode. In general, an organic light-emitting display apparatus operates as a thin-film transistor and organic light-emitting diodes are formed on a substrate, and as the organic light-emitting diodes emit light by themselves.

Recently, as the use of display apparatuses has diversified, various designs have been made to improve the quality of the display apparatuses.

SUMMARY

One or more embodiments may provide a display apparatus with high resolution, in which the performance of a capacitor is improved. However, this is merely an example, and the scope of the disclosure is not limited thereto.

Additional aspects will be set forth in part in the description that follows and, in part, will be apparent from the description, or may be learned by practice of the presented embodiments of the disclosure.

According to an aspect of the disclosure, a display apparatus includes a substrate including a sub-pixel area, a first thin-film transistor in the sub-pixel area, and including a first semiconductor layer, and a first gate electrode overlapping the first semiconductor layer with a gate-insulating layer therebetween, and a capacitor in the sub-pixel area, electrically connected to the first thin-film transistor, and including a first electrode including a same material as the first gate electrode, a second electrode overlapping the first electrode with a first inorganic insulating layer therebetween, a third electrode overlapping the second electrode with a second inorganic insulating layer therebetween, and a fourth electrode overlapping the third electrode with an insulating layer therebetween, the insulating layer being above the second inorganic insulating layer and including a first organic insulating layer defining an opening corresponding to the capacitor and filled with an inorganic insulating material.

The opening of the first organic insulating layer may expose the third electrode of the capacitor.

The fourth electrode of the capacitor may be above the inorganic insulating material.

A thickness of the inorganic insulating material in the opening of the first organic insulating layer may be less than a thickness of the first organic insulating layer.

The first electrode of the capacitor may be integrally formed with the first gate electrode.

The first semiconductor layer may include a channel area overlapping the first gate electrode, and a source area and a drain area at respective sides of the channel area, wherein the display apparatus further includes an electrode electrically connected to one of the source area or the drain area, and wherein the third electrode of the capacitor includes a same material as the electrode.

The insulating layer may be between the second inorganic insulating layer and the first organic insulating layer, and may further include a third inorganic insulating layer covering the third electrode of the capacitor.

The opening of the first organic insulating layer may expose an upper surface of the third inorganic insulating layer.

The opening of the first organic insulating layer may correspond to the sub-pixel area.

The display apparatus may further include a second thin-film transistor in the sub-pixel area, and including a second semiconductor layer, and a second gate electrode overlapping the second semiconductor layer, wherein the first semiconductor layer includes a silicon semiconductor, and wherein the second semiconductor layer includes an oxide semiconductor.

The third electrode of the capacitor may be electrically connected to the first electrode of the capacitor, wherein the fourth electrode of the capacitor is electrically connected to the second electrode of the capacitor.

The display apparatus may further include a first conductive layer under the first semiconductor layer, and overlapping the first semiconductor layer and the first gate electrode with an inorganic insulating layer therebetween.

The first conductive layer may be electrically connected to the second electrode and the fourth electrode of the capacitor.

According to another aspect of the disclosure, a display apparatus includes a substrate including a display area including pixels, a first thin-film transistor including a first semiconductor layer, and a first gate electrode overlapping the first semiconductor layer with a gate-insulating layer therebetween, and a capacitor electrically connected to the first thin-film transistor, and including a first electrode including a same material as the first gate electrode, a second electrode overlapping the first electrode with a first inorganic insulating layer therebetween, a third electrode overlapping the second electrode with a second inorganic insulating layer therebetween, and a fourth electrode overlapping the third electrode with a third inorganic insulating layer therebetween.

The display apparatus may further include a first data line extending in a first direction, and connected to one of a sub-pixel in an odd row or a sub-pixel in an even row, and a second data line apart from the first data line, at a same layer as the first data line, extending in the first direction, and connected to an other of the sub-pixel in the odd row and the sub-pixel in the even row.

The first semiconductor layer may include a channel area overlapping the first gate electrode, and a source area and a drain area at respective sides of the channel area, wherein the display apparatus further includes an electrode electrically connected to one of the source area or the drain area, and wherein the third electrode of the capacitor includes a same material as the electrode.

The display apparatus may further include a second thin-film transistor including a second semiconductor layer and a second gate electrode, wherein the first semiconductor layer includes a silicon semiconductor, and wherein the second semiconductor layer includes an oxide semiconductor.

The third electrode of the capacitor may be electrically connected to the first electrode of the capacitor, wherein the fourth electrode of the capacitor is electrically connected to the second electrode of the capacitor.

The display apparatus may further include a first conductive layer under the first semiconductor layer, and overlapping the first semiconductor layer and the first gate electrode.

The first conductive layer may be electrically connected to the second electrode and the fourth electrode of the capacitor.

BRIEF DESCRIPTION OF THE DRAWINGS

The above and other aspects of certain embodiments of the disclosure will be more apparent from the following description taken in conjunction with the accompanying drawings, in which.

DETAILED DESCRIPTION

Figure 1:
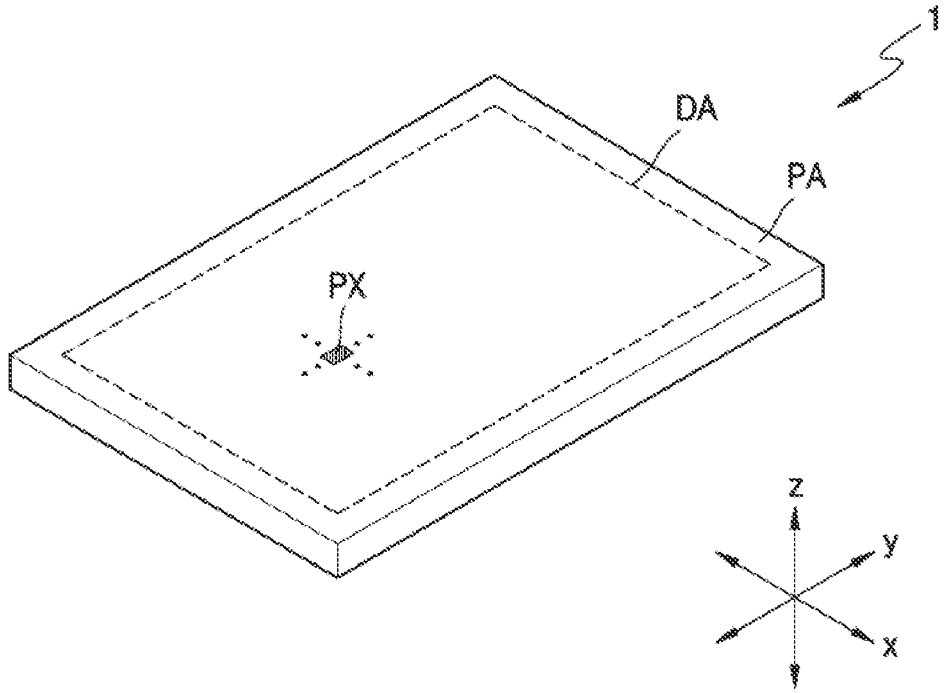
FIG. 1 is a schematic perspective view of a display apparatus according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic perspective view of a display apparatus according to one or more embodiments.

In one or more embodiments, a display apparatus 1 may display a moving image or a still image, and may be used as a display screen of various products, for example, a portable apparatus, such as a mobile phone, a smartphone, a tablet Personal Computer (PC), a mobile communication terminal, a personal digital assistant, an e-book terminal, a Portable Multimedia Player (PMP), a navigation device, or an Ultra Mobile PC (UMPC), a television (TV), a laptop, a monitor, a billboard, an Internet of Things (IoT) device, and the like.

Also, in one or more embodiments, the display apparatus 1 may be used in a wearable device, such as a smartwatch, a watch phone, an eyewear display, or a head-mounted display (HMD). Also, in one or more embodiments, the display apparatus 1 may be used as a display screen in an instrument cluster of a vehicle, a Center Information Display (CID) mounted on a center fascia or a dashboard of a vehicle, a room mirror display replacing a side-view mirror of a vehicle, or a car headrest monitor provided for rear-seat entertainment. For convenience of explanation, FIG. 1 shows that the display apparatus 1 is used as a smartphone.

Referring to FIG. 1, the display apparatus 1 may include a display area DA, and a peripheral area PA on an outer side of the display area DA. FIG. 1 shows that a shape of the display area DA is substantially a rectangle, but the present disclosure is not limited thereto. The display area DA may be in various shapes, such as a circle, an oval, and a polygon.

The display area DA may be an area where an image is displayed, and a plurality of sub-pixels PX may be arranged in the display area DA. Each sub-pixel PX may include a light-emitting diode, such as an organic light-emitting diode. Each sub-pixel PX may emit, for example, red light, green light, blue light, or white light.

The display area DA may provide a certain image by using light emitted from the sub-pixels PX. In the present specification, the sub-pixel PX may be defined as an emission area where any one of red, green, blue, and white light is emitted, as described above.

The peripheral area PA may be an area in which no sub-pixels PX is arranged, and in which no images are provided. A terminal, etc. may be arranged in the peripheral area PA, wherein a printed circuit board or a driver IC including a power supply line for driving the sub-pixels PX and driving circuitry may be connected to the terminal, etc.

Hereinafter, an organic light-emitting display apparatus is described as an example of the display apparatus 1 according to one or more embodiments. However, the display apparatus 1 is not limited thereto. For example, the display apparatus 1 may be an inorganic light-emitting display apparatus (or an inorganic EL display apparatus), or a quantum dot light-emitting display apparatus. For example, an emission layer of a light-emitting diode included in the display apparatus 1 may include an organic material or an inorganic material. Quantum dots may be located in a path of light emitted from the emission layer.

Figure 2:
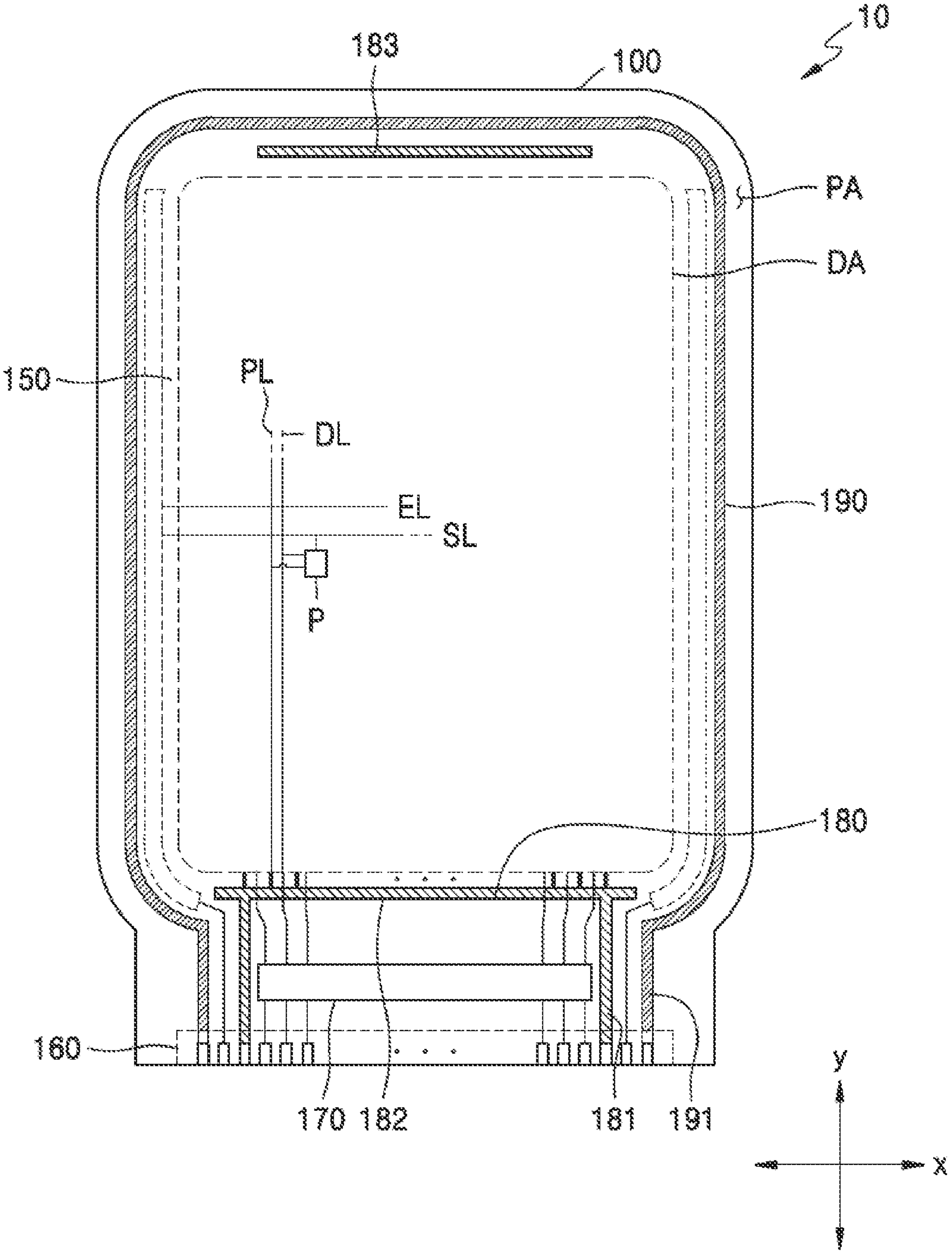
FIG. 2 is a schematic plan view of a display panel that may be included in a display apparatus, according to one or more embodiments.

FIG. 2 is a schematic plan view of a display panel provided to a display apparatus, according to one or more embodiments.

Referring to FIG. 2, the display apparatus may include a display panel 10 on which images are displayed. The display panel 10 may include the sub-pixels PX arranged in the display area DA. The sub-pixels PX may be electrically connected to outer circuits arranged in the peripheral area PA, respectively. In the peripheral area PA, driving circuits 150, a pad portion 160, a data driving circuit 170, a first power supply line 180, and a second power supply line 190 may be arranged.

The driving circuit(s) 150 may provide a scan signal to each sub-pixel PX through a scan line SL, and an emission control signal to each sub-pixel PX through an emission control line EL. Some of the sub-pixels PX arranged in the display area DA may be electrically connected to at least any one of the driving circuits 150 arranged on the left side or the right side of the display area DA.

The pad portion 160 may be on one side of a substrate 100. The pad portion 160 might not be covered by an insulating layer, and may be exposed, thus to be electrically connected to a printed circuit board. The pad portion 160 may be electrically connected to a pad portion of the printed circuit board. The printed circuit board may be configured to transmit a signal or power from a controller to the display panel 10, in one or more embodiments.

Control signals generated by the controller may be transmitted to the driving circuits 150 arranged on both the left side and the right side of the display area DA through the printed circuit board. The controller may provide a first power voltage to the first power supply line 180 through a first connection line 181, and may provide a second power voltage to the second power supply line 190 through a second connection line 191.

The first power voltage may be provided to each sub-pixel PX through a power voltage line PL connected to the first power supply line 180, and the second power voltage may be provided to an opposite electrode of each sub-pixel PX connected to the second power supply line 190. The power voltage line PL may extend in a first direction (e.g., a y direction). For example, the first power voltage may be a driving voltage ELVDD, and the second power voltage may be a common voltage ELVSS.

The data driving circuit 170 may be electrically connected to the data line DL. The data signal of the data driving circuit 170 may be provided to each sub-pixel PX through a connection wire connected to the pad portion 160 and through the data line DL connected to the connection wire. FIG. 2 shows that the data driving circuit 170 is arranged between the first power supply line 180 and the pad portion 160 on the substrate 100, but in one or more other embodiments, the data driving circuit 170 may be arranged on the printed circuit board.

The first power supply line 180 may include, for example, a first sub-line 182 and a second sub-line 183 that extend in parallel with each other in a second direction (e.g., an x direction) with the display area DA therebetween. The second power supply line 190 may have a loop shape with one open side, and may partially surround the display area DA.

Figure 3:
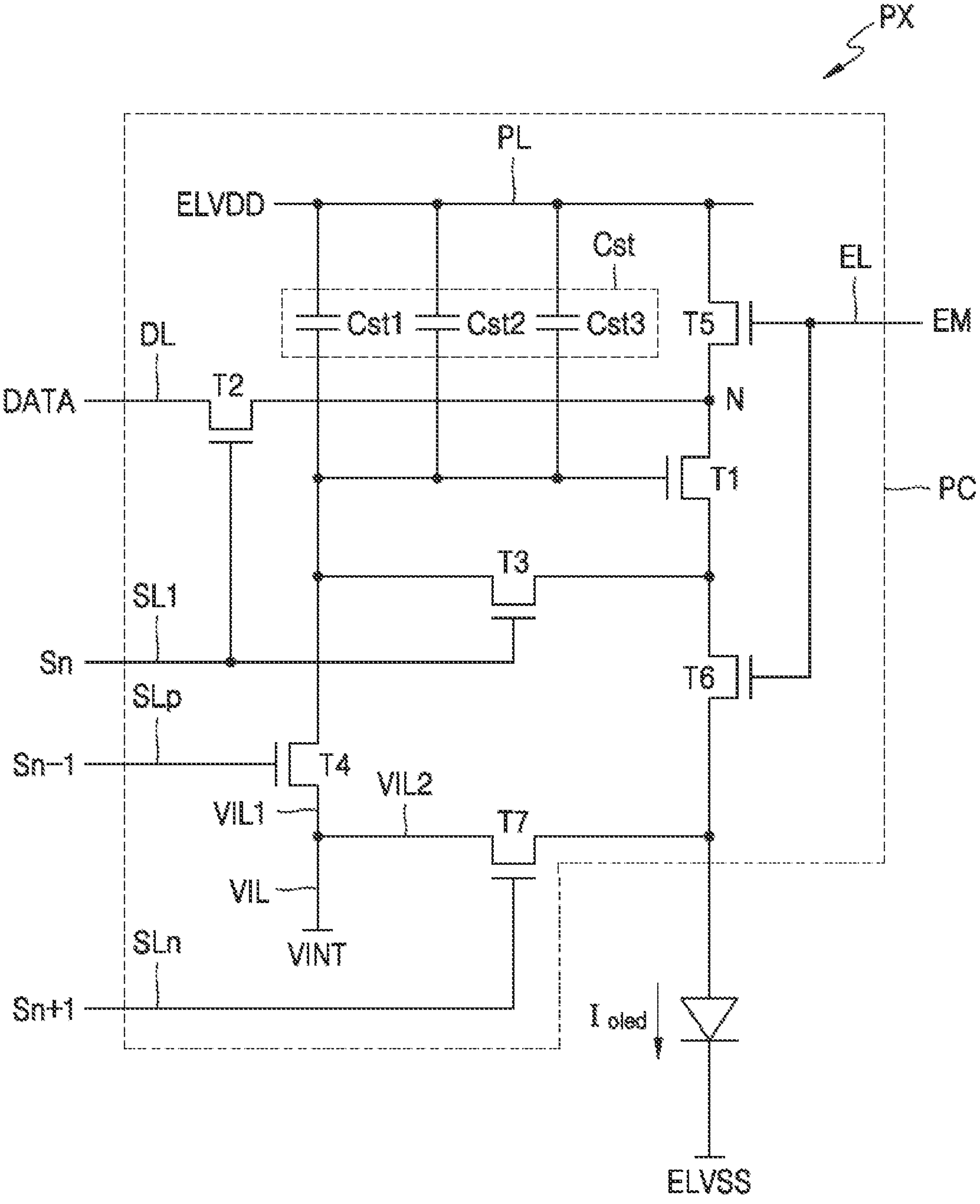
FIG. 3 is a schematic equivalent circuit diagram of a light-emitting diode of a display apparatus and a sub-pixel circuit electrically connected to the light-emitting diode, according to one or more embodiments.

FIG. 3 is a schematic equivalent circuit diagram of a light-emitting diode of a display apparatus and a sub-pixel circuit electrically connected to the light-emitting diode, according to one or more embodiments.

Referring to FIG. 3, one sub-pixel PX may include a sub-pixel circuit PC and an organic light-emitting diode OLED electrically connected to the sub-pixel circuit PC.

For example, the sub-pixel circuit PC may include a plurality of thin-film transistors T1 to T7 and a capacitor Cst. The first thin-film transistor T1 may be a driving transistor, and the second thin-film transistor T2 to the seventh thin-film transistor T7 may each be a switching transistor.

The first thin-film transistor T1 to the seventh thin-film transistor T7 and the capacitor Cst may be connected to signal lines SL1, SLp, SLn, EL, and DL, a first initialization voltage line VIL1, a second initialization voltage line VIL2, and the power voltage line PL.

The signal lines SL1, SLp, SLn, EL, and DL may include a scan line SL1 configured to transmit a scan signal Sn, a previous scan line SLp configured to transmit a previous scan signal Sn−1, a next scan line SLn configured to transmit a next scan signal Sn+1, an emission control line EL configured to transmit an emission control signal EM, and a data line DL configured to transmit a data signal DATA.

The power voltage line PL may be configured to transmit the first power voltage (e.g., the driving voltage ELVDD) to the first thin-film transistor T1, and an initialization voltage line VIL may be configured to transmit, to the sub-pixel PX, an initialization voltage VINT for initializing the first thin-film transistor T1 and the organic light-emitting diode OLED. For example, the first initialization voltage line VIL1 may be configured to transmit the initialization voltage VINT to the fourth thin-film transistor T4, and the second initialization voltage line VIL2 may be configured to transmit the initialization voltage VINT to the seventh thin-film transistor T7.

The first thin-film transistor T1 may be connected to the power voltage line PL via the fifth thin-film transistor T5, and may be electrically connected to the organic light-emitting diode OLED via the sixth thin-film transistor T6. The first thin-film transistor T1 may function as a driving transistor, and may receive a data signal DATA according to a switching operation of the second thin-film transistor T2, thereby providing a driving current bled to the organic light-emitting diode OLED.

The second thin-film transistor T2 may be connected to the scan line SL1 and to the data line DL, may function as a data write transistor, may be turned on in response to a scan signal Sn transmitted through the scan line SL1, and thus may perform a switching operation in which the data signal DATA transmitted through the data line DL is transmitted to a node N.

The third thin-film transistor T3 may be connected to the organic light-emitting diode OLED via the sixth thin-film transistor T6. The third thin-film transistor T3 may function as a compensation transistor, may be turned on in response to the scan signal Sn transmitted through the scan line SL1, and may diode-connect the first thin-film transistor T1 so that a threshold voltage of the first thin-film transistor T1 may be compensated.

The fourth thin-film transistor T4 functions as a first initialization transistor, is turned on in response to the previous scan signal Sn−1 transmitted through the previous scan line SLp, and is configured to transmit the initialization voltage VINT from the first initialization voltage line VIL1 to a gate electrode of the first thin-film transistor T1, thereby initializing a gate voltage of the first thin-film transistor T1.

The fifth thin-film transistor T5 and the sixth thin-film transistor T6 may respectively be an operation control transistor and an emission control transistor, may be concurrently or substantially simultaneously turned on in response to the emission control signal EM transmitted through the emission control line EL, and may form a current path to allow the driving current bled to flow in a direction towards the organic light-emitting diode OLED from the power voltage line PL.

The seventh thin-film transistor T7 is a second initialization transistor, is turned on in response to the next scan signal Sn+1 transmitted through the next scan line SLn, and is configured to transmit the initialization voltage VINT from the second initialization voltage line VIL2 to the organic light-emitting diode OLED, thus performing an initialization operation of initializing the organic light-emitting diode OLED. In some embodiments, the seventh thin-film transistor T7 may be omitted.

FIG. 3 shows that the fourth thin-film transistor T4 is connected to the previous scan line SLp, and the seventh thin-film transistor T7 is connected to a separate next scan line SLn. In some embodiments, the seventh thin-film transistor T7 may be connected to the previous scan line SLp along with the fourth thin-film transistor T4.

The capacitor Cst may be connected to the power voltage line PL and to the gate electrode of the first thin-film transistor T1, and may store and maintain a voltage corresponding to a difference in voltages of both ends so that a voltage applied to the gate electrode of the first thin-film transistor T1 may be maintained.

The capacitor Cst may include capacitors connected in parallel. For example, the capacitor Cst may include a first capacitor Cst1, a second capacitor Cst2, and a third capacitor Cst3 that are connected to each other in parallel.

The organic light-emitting diode OLED may include a sub-pixel electrode and an opposite electrode. The opposite electrode may receive the second power voltage (e.g., the common voltage ELVSS). The organic light-emitting diode OLED may receive the driving current bled from the first thin-film transistor T1 to emit light, and thus, images are displayed.

FIG. 3 shows that the third thin-film transistor T3 and the fourth thin-film transistor T4 each have one gate electrode, but in some embodiments, the third thin-film transistor T3 and the fourth thin-film transistor T4 may each have a dual gate electrode.

In one or more embodiments, the first thin-film transistor T1 to the seventh thin-film transistor T7 may each be a silicon-based p-channel MOSFET (PMOS) transistor. However, the present disclosure is not limited thereto. In some embodiments, one or more of the first thin-film transistor T1 to the seventh thin-film transistor T7 may be an n-channel MOSFET (NMOS) transistor, and the others thereof may each be a PMOS transistor. For example, the third thin-film transistor T3 and the fourth thin-film transistor T4 among the first thin-film transistor T1 to the seventh thin-film transistor T7 may each be an NMOS transistor, and the others thereof may each be a PMOS transistor. Alternatively, one or more of the first thin-film transistor T1 to the seventh thin-film transistor T7 may be an NMOS transistor, and the others thereof may each be a PMOS transistor.

The first thin-film transistor T1 directly affecting the brightness of the display apparatus is configured to include a semiconductor layer including polycrystalline silicon having high reliability, and thus, a high-resolution display apparatus may be realized.

Because an oxide semiconductor has relatively high carrier mobility and a relatively low leakage current, a voltage drop is not significant despite a relatively long operation time. That is, because a color change in images according to the voltage drop is not noticeable even during a low-frequency operation, the display apparatus may operate in a low frequency. As described, because a leakage current is low in the oxide semiconductor, at least one of the third thin-film transistor T3 and/or the fourth thin-film transistor T4 connected to the gate electrode of the first thin-film transistor T1 is employed as an oxide semiconductor to reduce or prevent a leakage current, which may flow into the gate electrode of the first thin-film transistor T1, as well as to reduce the amount of power consumed.

The sub-pixel circuit PC is not limited to the number of thin-film transistors, the number of capacitors, and a circuit design described with reference to FIG. 3, and the numbers and the circuit design may vary.

Figure 4:
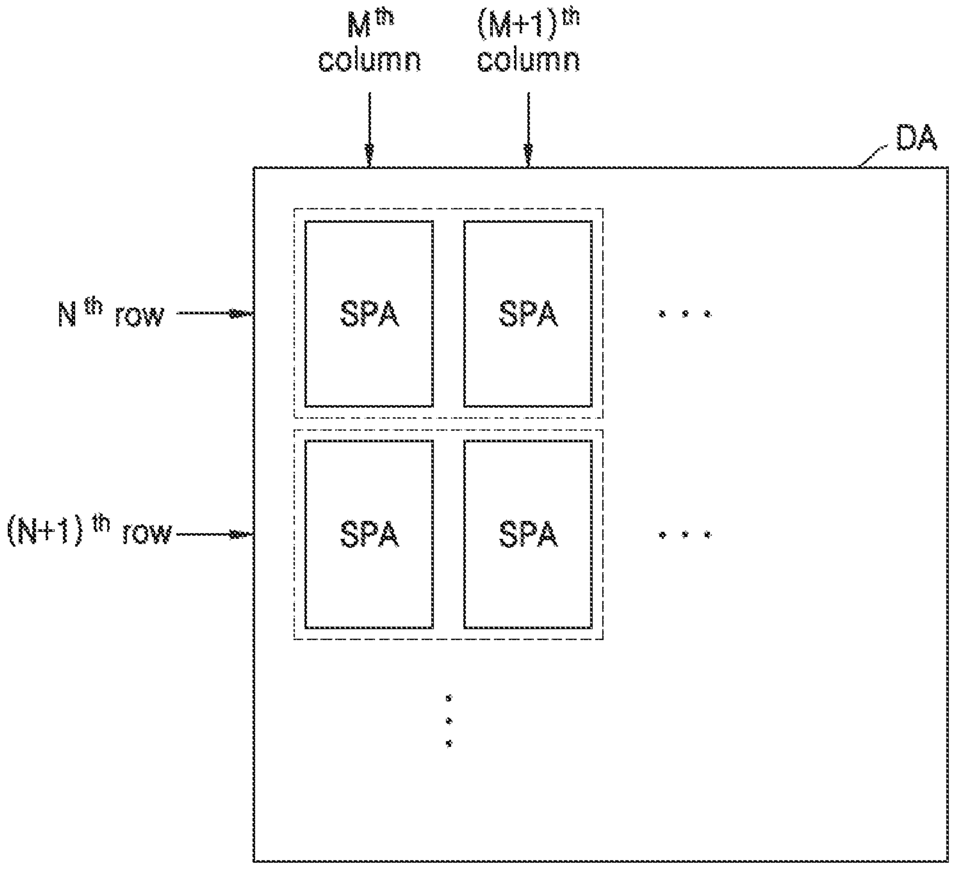
FIG. 4 is a schematic plan view of sub-pixel areas located in a display area of a display apparatus, according to one or more embodiments.
Figure 5:
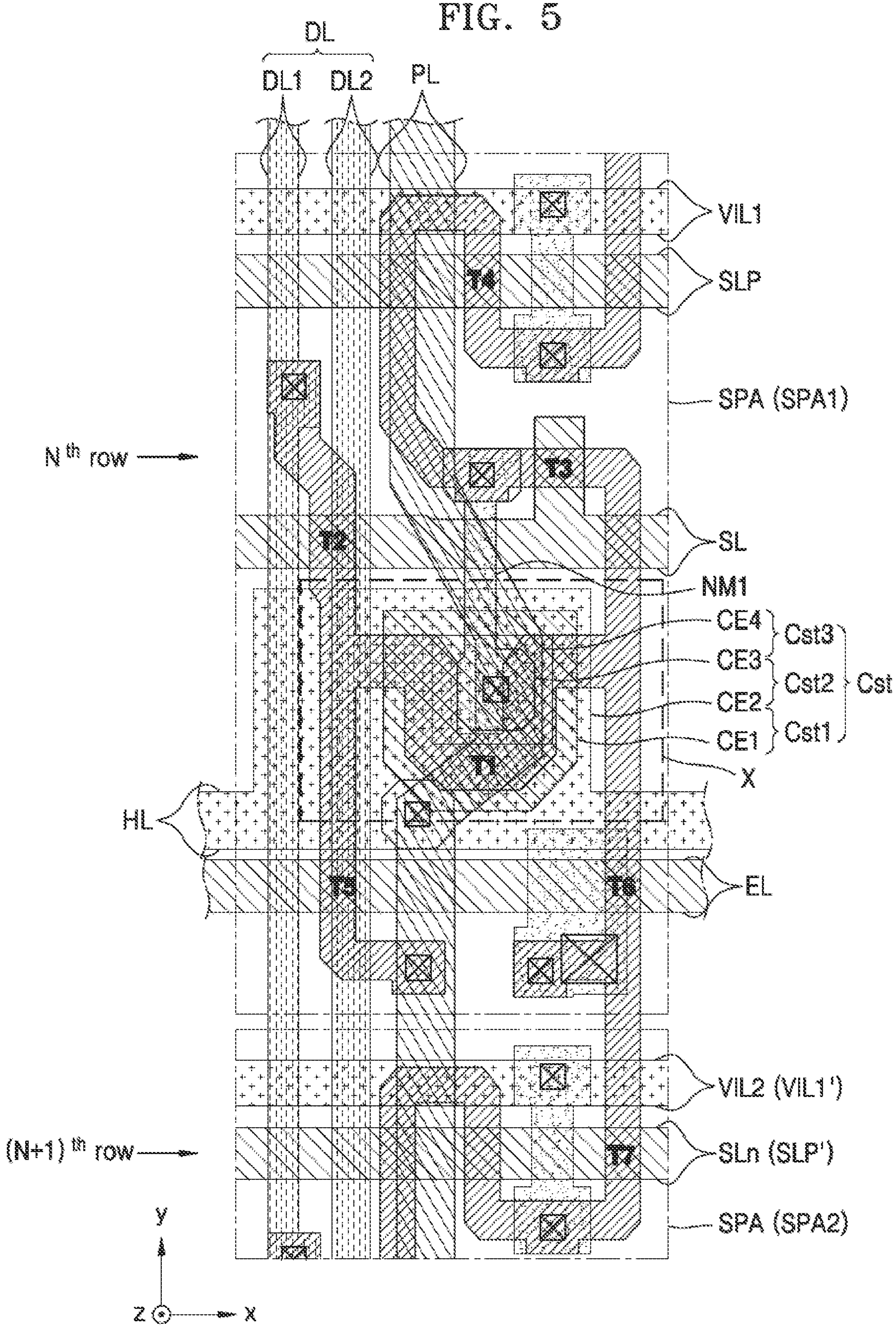
FIG. 5 is a schematic plan view of a sub-pixel circuit arranged in a sub-pixel area of a display apparatus, according to one or more embodiments.

FIG. 4 is a schematic plan view of sub-pixel areas located in a display area of a display apparatus, according to one or more embodiments, and FIG. 5 is a plan view of a sub-pixel circuit arranged in a sub-pixel area of a display apparatus, according to one or more embodiments. In the display area DA described with reference to FIG. 1, sub-pixel circuits are arranged. FIGS. 4 and 5 show the sub-pixel circuits arranged in the display area DA. Each of the sub-pixel circuits is arranged in a sub-pixel area SPA forming a row and a column. Here, the sub-pixel area SPA may be an area where one sub-pixel is arranged, for example, an area where a sub-pixel circuit is arranged.

FIG. 4 shows sub-pixel areas SPA in an $M^{th}$ column (or an odd column) or an $(M+1)^{th}$ column (or an even column), and in an $N^{th}$ row (or an odd row) or an $(N+1)^{th}$ row (or an even row). In one or more embodiments, two adjacent sub-pixel areas SPA in the same row (e.g., the sub-pixel area SPA in the $M^{th}$ column and the sub-pixel area SPA in the $(M+1)^{th}$ column that are in the same row) may have a bilateral symmetry structure with respect to a boundary line therebetween. In some embodiments, the sub-pixel area SPA in the $M^{th}$ column and the sub-pixel area SPA in the $(M+1)^{th}$ column, both of which are in the same row, may have an asymmetry structure with respect to a boundary line therebetween.

FIG. 5 shows portions of the sub-pixel area SPA in the $N^{th}$ row (or the odd row) and the sub-pixel area SPA in the $(N+1)^{th}$ row, both of which are in the same column, for example, the $M^{th}$ column.

The scan line SL1, the previous scan line SLp, the next scan line SLn, the emission control line EL, the first initialization voltage line VIL1, and the second initialization voltage line VIL2 may each extend in a second direction (e.g., the x direction) and may be arranged apart from each other. The first data line DL1, the second data line DL2, and the power voltage line PL may respectively extend in the first direction (e.g., the y direction), and may be arranged apart from each other.

In each sub-pixel area SPA, a plurality of thin-film transistors and at least one capacitor may be arranged. FIG. 5 shows that seven thin-film transistors (T1 to T7) and one capacitor Cst are arranged in each sub-pixel area SPA. In one or more embodiments, the capacitor Cst may have a structure in which the first capacitor Cst1, the second capacitor Cst2, and the third capacitor Cst3 are connected in parallel.

In one or more embodiments, the first thin-film transistor T1 to the seventh thin-film transistor T7 may each be a transistor including a silicon semiconductor layer (hereinafter, referred to as a silicon transistor) and may be formed along a pattern of the silicon semiconductor.

The first thin-film transistor T1 to the seventh thin-film transistor T7, the capacitor Cst, the signal lines SL1, SLp, SLn, EL, and DL, the first initialization voltage line VIL1, the second initialization voltage line VIL2, and the power voltage line PL, which are arranged in respective sub-pixel areas SPA, may have an electrical connection structure described above with reference to FIG. 3.

Referring to one sub-pixel area SPA arranged in the $M^{th}$ column and the $N^{th}$ row (hereinafter, referred to as a first sub-pixel area SPA1), the first thin-film transistor T1 to the sixth thin-film transistor T6 and the capacitor Cst, which correspond to one sub-pixel circuit (PC of FIG. 3) described above with reference to FIG. 3, may be arranged in the first sub-pixel area SPA1. The seventh thin-film transistor T7 electrically connected to the first thin-film transistor T1 to the sixth thin-film transistor T6 and the capacitor Cst, which are arranged in the first sub-pixel area SPA1, may be located in the $(N+1)^{th}$ row. In other words, the first thin-film transistor T1 to the sixth thin-film transistor T6 and the capacitor Cst arranged in the first sub-pixel area SPA1 may be electrically connected to the seventh thin-film transistor T7 arranged in one sub-pixel area SPA in the $M^{th}$ column and the $(N+1)^{th}$ row (hereinafter, referred to as a second sub-pixel area SPA2).

The first thin-film transistor T1 to the sixth thin-film transistor T6 and the capacitor Cst, which are arranged in the first sub-pixel area SPA1, and the seventh thin-film transistor T7 arranged in the second sub-pixel area SPA2, may operate to turn on/off the same organic light-emitting diode (OLED of FIG. 3).

The seventh thin-film transistor T7 arranged in the second sub-pixel area SPA2 may receive the next scan signal Sn+1 and the initialization voltage VINT through the next scan line SLn and through the second initialization voltage line VIL2, respectively, wherein the next scan line SLn and the second initialization voltage line VIL2 pass the second sub-pixel area SPA2. The next scan line SLn may correspond to a previous scan line SLp' configured to provide a previous scan signal to the fourth thin-film transistor T4 arranged in the second sub-pixel area SPA2. Also, the second initialization voltage line VIL2 may correspond to a first initialization voltage line VIL1' configured to transmit an initialization voltage to the fourth thin-film transistor T4 arranged in the second sub-pixel area SPA2. That is, the first initialization voltage line VIL1, the previous scan line SLp, the second initialization voltage line VIL2, and the next scan line SLn may be shared in two sub-pixel circuits arranged adjacent to each other in the y direction.

In one or more embodiments, data lines DL may be arranged in a sub-pixel area SPA in one column. For example, the first data line DL1 and the second data line DL2 may be arranged in parallel in the sub-pixel area SPA in the $M^{th}$ column. The first data line DL1 and the second data line DL2 may be arranged in parallel with each other in the first direction (e.g., the y direction). The first data line DL1 may be electrically connected to a sub-pixel circuit in the first sub-pixel area SPA1 in the $N^{th}$ row, and the second data line DL2 may be electrically connected to a sub-pixel circuit in the second sub-pixel area SPA2 in the $(N+1)^{th}$ row. FIG. 5 shows that the first data line DL1 and the second data line DL2 are adjacent to each other on the left side of the capacitor Cst, but the present disclosure is not limited thereto. In some embodiments, any one of the first data line DL1 and the second data line DL2 may be arranged on the left side of the capacitor Cst, and the other thereof may be arranged on the right side of the capacitor Cst. The first data line DL1 and the second data line DL2 of FIG. 5 do not overlap the capacitor Cst, but in some embodiments, any one of the first data line DL1 and the second data line DL2 may overlap the capacitor Cst.

As described, when a plurality of data lines DL are arranged in a sub-pixel area SPA in each column, the operation speed of the display apparatus may increase. However, compared to when one data line DL is arranged in one sub-pixel area SPA, an area of the capacitor Cst may decrease. Also, because an area of the sub-pixel area SPA corresponding to one sub-pixel decreases in a display apparatus with high resolution, the area of the capacitor Cst may further decrease. In this case, in one or more embodiments, the display apparatus includes a capacitor Cst having improved performance compared to a display apparatus having the same area, and thus, a relatively high-resolution display apparatus, in which the capacitance of a capacitor may be sufficiently secured, may be provided despite a relatively small area of the capacitor Cst. The detailed structure is described below with reference to FIGS. 6 to 10.

Figure 6:
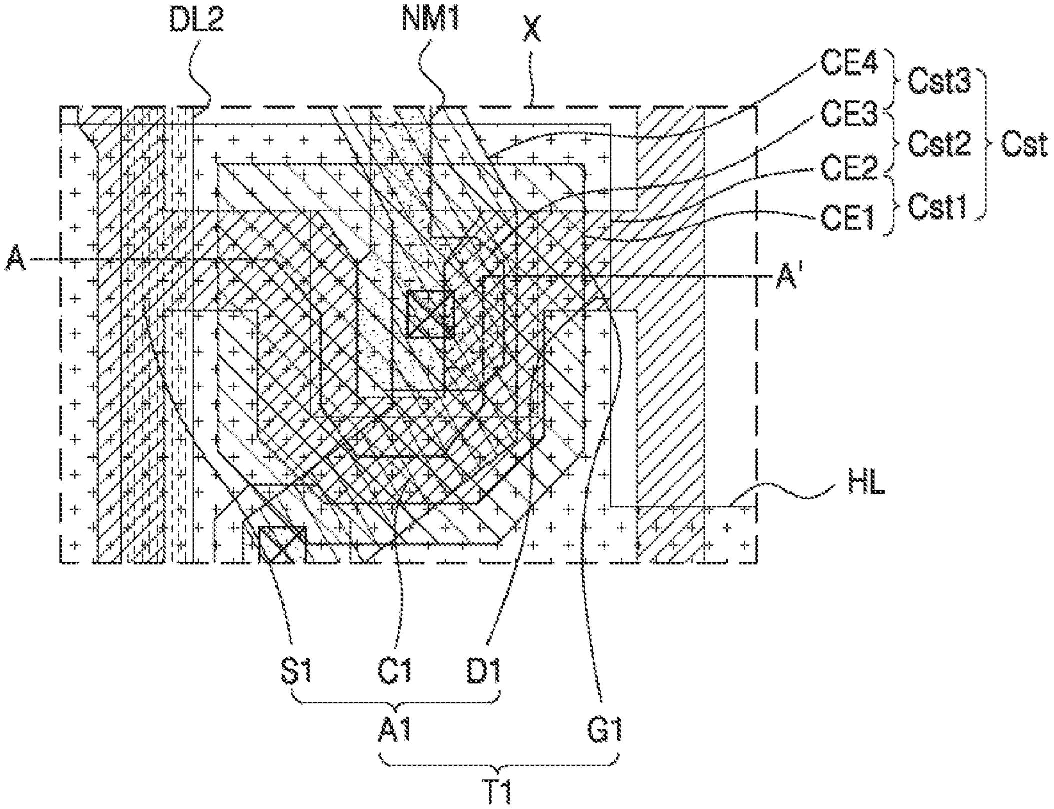
FIG. 6 is an enlarged view of a portion of the sub-pixel circuit of FIG. 5.
Figure 7:
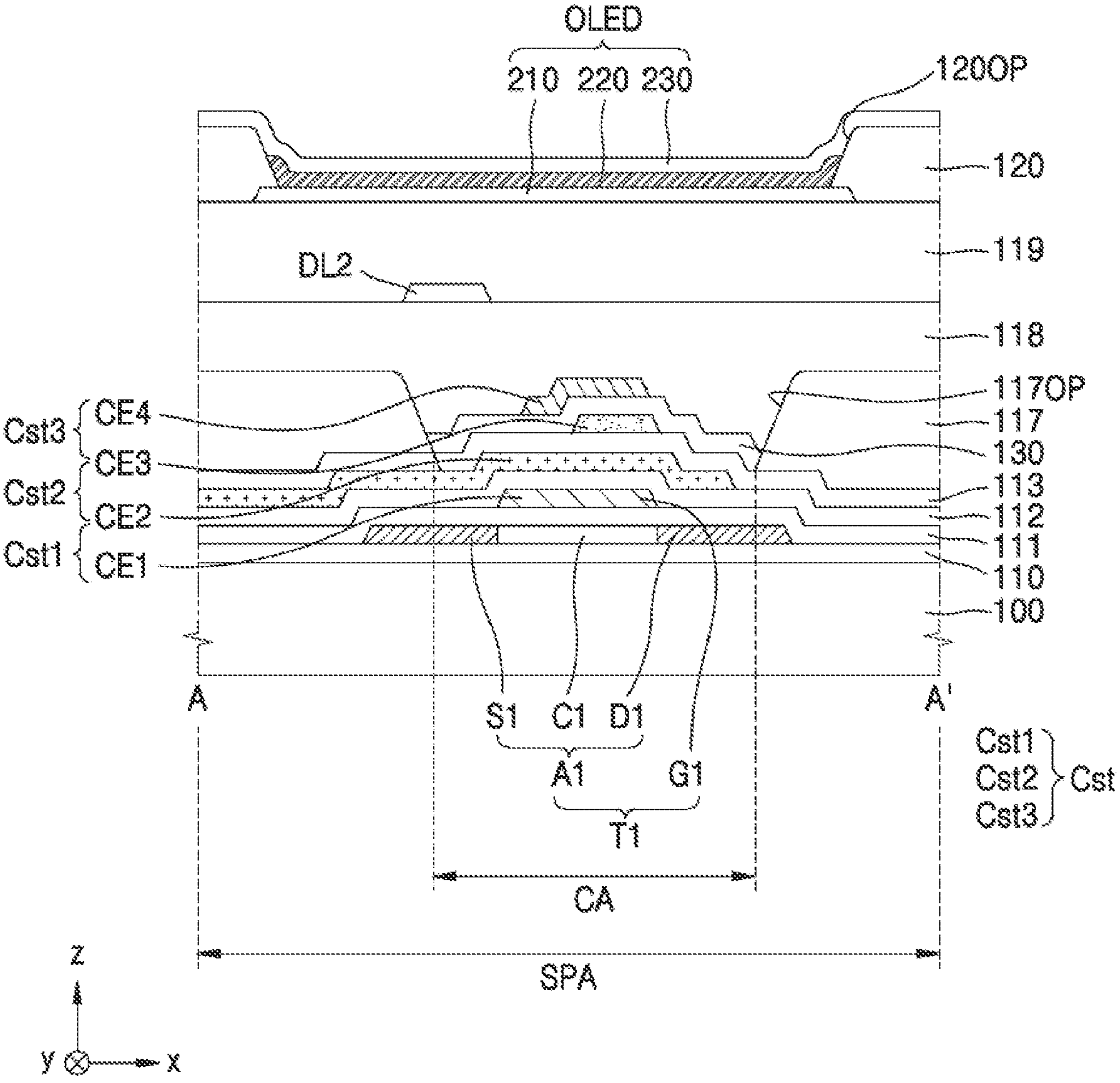
FIG. 7 is a schematic cross-sectional view of a display apparatus according to one or more embodiments.

FIG. 6 is an enlarged view of portion X of FIG. 5, and FIG. 7 is a schematic cross-sectional view of a display apparatus taken along the line A-A' of FIG. 6.

Hereinafter, the embodiments are described according to a stack order with reference to FIGS. 6 and 7.

Referring to FIGS. 6 and 7, a sub-pixel circuit in a sub-pixel area SPA may include the first thin-film transistor T1, which is a driving transistor, and the capacitor Cst electrically connected to the first thin-film transistor T1. In one or more embodiments, the capacitor Cst may include a plurality of capacitors connected in parallel. For example, the capacitor Cst may be a capacitor in which the first capacitor Cst1, the second capacitor Cst2, and the third capacitor Cst3 are connected in parallel. The capacitor Cst may include at least four capacitor electrodes. For example, the capacitor Cst may include a first capacitor electrode CE1, a second capacitor electrode CE2 on the first capacitor electrode CE1, a third capacitor electrode CE3 on the second capacitor electrode CE2, and a fourth capacitor electrode CE4 on the third capacitor electrode CE3. A plurality of insulating layers may be arranged under and/or on the first thin-film transistor T1 and the components of the capacitor Cst.

The substrate 100 may include a glass material or polymer resin. The polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, or the like. The substrate 100 including the polymer resin may be flexible, rollable, or bendable. The substrate 100 may have a multilayered structure that includes a layer including the above polymer resin and an inorganic layer, in one or more embodiments.

A buffer layer 110 may decrease or prevent the penetration of foreign materials, moisture, or external air from the bottom of the substrate 100 and provide a flat surface on the substrate 100. The buffer layer 110 may include an inorganic material, such as oxide or nitride, an organic material, or a compound of organic and inorganic materials, and may have a single-layer structure or a multilayered structure including organic and inorganic materials.

On the buffer layer 110, a first semiconductor layer A1 of the first thin-film transistor T1 may be located. In one or more embodiments, the first semiconductor layer A1 may include a silicon semiconductor including amorphous silicon or polycrystalline silicon. The first semiconductor layer A1 may include a first channel area Cl, and may include a first source area S1 and a first drain area D1 that are arranged on respective sides of the first channel area Cl and that include impurity areas doped with impurities.

A first gate-insulating layer 111 may be located on the first semiconductor layer A1. The first gate-insulating layer 111 may be an inorganic insulating layer including an inorganic insulating material, such as silicon oxide, silicon nitride, and/or silicon oxynitride and may have a single-layer structure or a multilayered structure including the above material.

A first gate electrode G1 and the first capacitor electrode CE1 may be located on the first gate-insulating layer 111. FIG. 6 shows that the first gate electrode G1 and the first capacitor electrode CE1 are integrally formed. In other words, the first gate electrode G1 may perform functions of the first capacitor electrode CE1, or vice versa. In some embodiments, the first capacitor electrode CE1 may be separately formed instead of being integrally formed with the first gate electrode G1 of the first thin-film transistor T1. For example, the first capacitor electrode CE1 may be separately formed on the same layer as the first gate electrode of the first thin-film transistor T1.

The first gate electrode G1 and/or the first capacitor electrode CE1 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and/or the like and may be one or more layers including the above material.

A first interlayer insulating layer 112 may be located on the first gate electrode G1 and/or the first capacitor electrode CE1. The first interlayer insulating layer 112 may be an inorganic insulating layer including an inorganic insulating material, such as silicon oxide, silicon nitride, and/or silicon oxynitride, and may have a single-layer structure or a multilayered structure including the above material.

The second capacitor electrode CE2 may be located on the first interlayer insulating layer 112. The second capacitor electrode CE2 may overlap at least a portion of the first capacitor electrode CE1. The second capacitor electrode CE2 may be, for example, a portion of an electrode voltage line HL that overlaps the first gate electrode G1 of the first thin-film transistor T1. The second capacitor electrode CE2 may form the first capacitor Cst1 together with the first gate electrode G1 (or the first capacitor electrode CE1). Therefore, the first interlayer insulating layer 112 may be arranged between the first capacitor electrode CE1 and the second capacitor electrode CE2 to function as a dielectric layer of the first capacitor Cst1.

The second capacitor electrode CE2 may include Al, Pt, Pd, Ag, Mg, Au, Ni, Nd, Ir, Cr, Li, Ca, Mo, Ti, W, Cu, and/or the like, and may be one or more layers including the above material.

A second interlayer insulating layer 113 may be located on the second capacitor electrode CE2. The second interlayer insulating layer 113 may be an inorganic insulating layer including an inorganic insulating material, such as silicon oxide, silicon nitride, and/or silicon oxynitride and may have a single-layer structure or a multilayered structure including the above material.

The third capacitor electrode CE3 may be located on the second interlayer insulating layer 113. The third capacitor electrode CE3 may overlap at least a portion of the second capacitor electrode CE2. The third capacitor electrode CE3 may be, for example, a portion of a first connection electrode NM1 that overlaps the second capacitor electrode CE2. The first connection electrode NM1 may be an electrode connecting a third semiconductor layer of the third thin-film transistor (T3 of FIG. 5) to the first gate electrode G1 of the first thin-film transistor T1. An end of the first connection electrode NM1 may contact the first gate electrode G1 of the first thin-film transistor T1 through a contact hole, and the other end of the first connection electrode NM1 may contact a third drain area of the third semiconductor layer of the third thin-film transistor (T3 of FIG. 5) through the contact hole.

The third capacitor electrode CE3 may form the second capacitor Cst2 together with the second capacitor electrode CE2. Therefore, the second interlayer insulating layer 113 may be arranged between the second capacitor electrode CE2 and the third capacitor electrode CE3 to function as a dielectric layer of the second capacitor Cst2.

The third capacitor electrode CE3 may include Al, Pt, Pd, Ag, Mg, Au, Ni, Nd, Ir, Cr, Li, Ca, Mo, Ti, W, Cu, and/or the like, and may be one or more layers including the above material. In one or more embodiments, the third capacitor electrode CE3 may have a multilayered structure of Ti/Al/Ti.

A first planarization layer 117 may be located on the second interlayer insulating layer 113. The first planarization layer 117 may include an organic material. For example, the first planarization layer 117 may include organic insulating materials, such as a general-purpose polymer, such as polymethylmethacrylate (PMMA) or polystyrene (PS), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and any blend thereof.

The first planarization layer 117 may include/define an opening 1170P corresponding to a capacitor area CA. The capacitor area CA may correspond to an area where the capacitor Cst is arranged. The opening 1170P of the first planarization layer 117 may expose the third capacitor electrode CE3 of the capacitor Cst and a portion of an upper surface of the second interlayer insulating layer 113. FIG. 7 shows that the opening 1170P of the first planarization layer 117 only corresponds to the capacitor area CA, and that the first planarization layer 117 is arranged on portions of the sub-pixel area SPA except for the capacitor area CA, but the present disclosure is not limited thereto. In some embodiments, the opening 1170P of the first planarization layer 117 may correspond to the sub-pixel area SPA including the capacitor area CA.

The opening 1170P of the first planarization layer 117 may be filled with an inorganic insulating material 130. The inorganic insulating material 130 may cover an upper surface of the second interlayer insulating layer 113 and a portion of a side surface of the opening 1170P that are exposed by the opening 1170P of the first planarization layer 117. The inorganic insulating material 130 may include, for example, silicon oxide, silicon nitride, and/or silicon oxynitride.

The fourth capacitor electrode CE4 may be arranged on the inorganic insulating material 130. The fourth capacitor electrode CE4 may overlap at least a portion of the third capacitor electrode CE3. The fourth capacitor electrode CE4 may be a portion of the power voltage line PL that overlaps the third capacitor electrode CE3. The fourth capacitor electrode CE4 may form the third capacitor Cst3 together with the third capacitor electrode CE3. Therefore, the inorganic insulating material 130 arranged in the opening 1170P of the first planarization layer 117 may be arranged between the fourth capacitor electrode CE4 and the third capacitor electrode CE3, and may function as a dielectric layer of the third capacitor Cst3.

The fourth capacitor electrode CE4 may include Al, Pt, Pd, Ag, Mg, Au, Ni, Nd, Ir, Cr, Li, Ca, Mo, Ti, W, Cu, and/or the like, and may be one or more layers including the above material. In one or more embodiments, the third capacitor electrode CE3 may have a multilayered structure of Ti/Al/Ti.

In one or more embodiments, a thickness of the inorganic insulating material 130 arranged in the opening 1170P of the first planarization layer 117 may be less than a thickness of the first planarization layer 117.

As a comparative example, when a first planarization layer does not include/define an opening corresponding to a capacitor area, and when a third capacitor electrode overlaps a fourth capacitor electrode with the first planarization layer therebetween, the first planarization layer may function as a dielectric layer of a third capacitor formed by the third capacitor electrode and the fourth capacitor electrode. The first planarization layer may be a layer including an organic material and having a flat upper surface, and may have a relatively large thickness compared to inorganic insulating layers. As a thickness of a dielectric layer increases, the capacitance of a corresponding capacitor decreases, and in this case, it may be difficult to sufficiently secure the capacitance of the capacitor.

According to one or more embodiments, the first planarization layer 117 may at least include/define the opening 1170P corresponding to the capacitor area CA, the inorganic insulating material 130 may be arranged in the opening 1170P, and the inorganic insulating material 130 may function as a dielectric layer of the third capacitor Cst3 formed by the third capacitor electrode CE3 and the fourth capacitor electrode CE4. Because the thickness of the inorganic insulating material 130 is less than that of the first planarization layer 117, the capacitance of the third capacitor Cst may be improved. Therefore, although an area of the capacitor Cst decreases while a display apparatus with relatively high resolution is realized, the performance of the display apparatus may be sufficiently secured.

In one or more embodiments, the third capacitor electrode CE3 of the capacitor Cst is electrically connected to the first capacitor electrode CE1. For example, the third capacitor electrode CE3 may be electrically connected to the first capacitor electrode CE1 through a contact hole penetrating the first gate-insulating layer 111, the first interlayer insulating layer 112, and the second interlayer insulating layer 113.

Also, the fourth capacitor electrode CE4 of the capacitor Cst may be electrically connected to the second capacitor electrode CE2. For example, the fourth capacitor electrode CE4 may be electrically connected to the second capacitor electrode CE2 through a contact hole penetrating the inorganic insulating material 130 or the first planarization layer 117 and the second interlayer insulating layer 113. That is, the capacitor Cst may have a structure in which the first capacitor Cst1, the second capacitor Cst2, and the third capacitor Cst3 are connected in parallel.

A second planarization layer 118 may be arranged to cover the fourth capacitor electrode CE4. For example, the second planarization layer 118 may cover the first planarization layer 117, the inorganic insulating material 130, and the fourth capacitor electrode CE4.

The second planarization layer 118 may include an organic material. For example, the second planarization layer 118 may include one or more organic insulating materials, such as a general-purpose polymer, such as PMMA or PS, a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and/or any blend thereof.

The second data line DL2 may be located on the second planarization layer 118. In one or more embodiments, the first data line (DL1 of FIG. 5) may be arranged on the same layer (e.g., the second planarization layer 118) as the second data line DL2. The second data line DL2 may include Al, Pt, Pd, Ag, Mg, Au, Ni, Nd, Ir, Cr, Li, Ca, Mo, Ti, W, Cu, and/or the like, and may be one or more layers including the above material.

A third planarization layer 119 may be arranged to cover the second data line DL2. The third planarization layer 119 may include an organic material. For example, the third planarization layer 119 may include organic insulating materials, such as a general-purpose polymer, such as PMMA or PS, a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and any blend thereof.

The organic light-emitting diode OLED may be located on the third planarization layer 119. The organic light-emitting diode OLED may include a sub-pixel electrode 210, an emission layer 220, and an opposite electrode 230 above the third planarization layer 119.

The sub-pixel electrode 210 may be a (semi-)light-transmissive electrode or a reflection electrode. In some embodiments, the sub-pixel electrode 210 may include a reflection layer including Ag, Mg, Al, Pt, Pd, Au, Ni, Nd, Ir, Cr, and/or a combination thereof, and a transparent or translucent electrode layer formed on the reflection layer. The transparent or translucent electrode layer may include at least one material selected from the group consisting of indium tin oxide (ITO), indium zinc oxide (IZO), zinc oxide (ZnO), indium oxide ($In_2O_3$), indium gallium oxide (IGO), and/or aluminum zinc oxide (AZO). In some embodiments, the sub-pixel electrode 210 may have a multilayered structure of ITO/Ag/ITO.

The emission layer 220 may include a low-molecular-weight or high-molecular-weight organic material. At least one layer may be further arranged between the sub-pixel electrode 210 and the opposite electrode 230, the at least one layer being selected from among a hole injection layer (HIL), a hole transport layer (HTL), an electron transport layer (ETL), and/or an electron injection layer (EIL).

Edges of the sub-pixel electrode 210 may be covered by a bank layer 120, and an inner portion of the sub-pixel electrode 210 may overlap the emission layer 220 through an opening 1200P of the bank layer 120. The bank layer 120 may include, for example, organic insulating materials, such as polyimide, polyamide, acryl resin, benzocyclobutene (BCB), hexamethyldisiloxane (HMDSO), and/or phenol resin.

The opposite electrode 230 may be a light-transmissive electrode or a reflection electrode. In some embodiments, the opposite electrode 230 may be a transparent or translucent electrode, and may include a metal thin-film having a low work function and including Li, Ca, LiF/Ca, LiF/Al, Al, Ag, Mg, and/or a compound thereof. Also, a transparent conductive oxide (TCO) layer including ITO, IZO, ZnO, and/or $In_2O_3$ may be further located on the metal thin-film.

The sub-pixel electrode 210 may be formed in each organic light-emitting diode OLED, but the opposite electrode 230 may be formed corresponding to the organic light-emitting diodes OLED. In other words, the organic light-emitting diodes OLED may share the opposite electrode 230, and a stack structure of the sub-pixel electrode 210, the emission layer 220, and a portion of the opposite electrode 230 may correspond to the organic light-emitting diode OLED.

Figure 8:
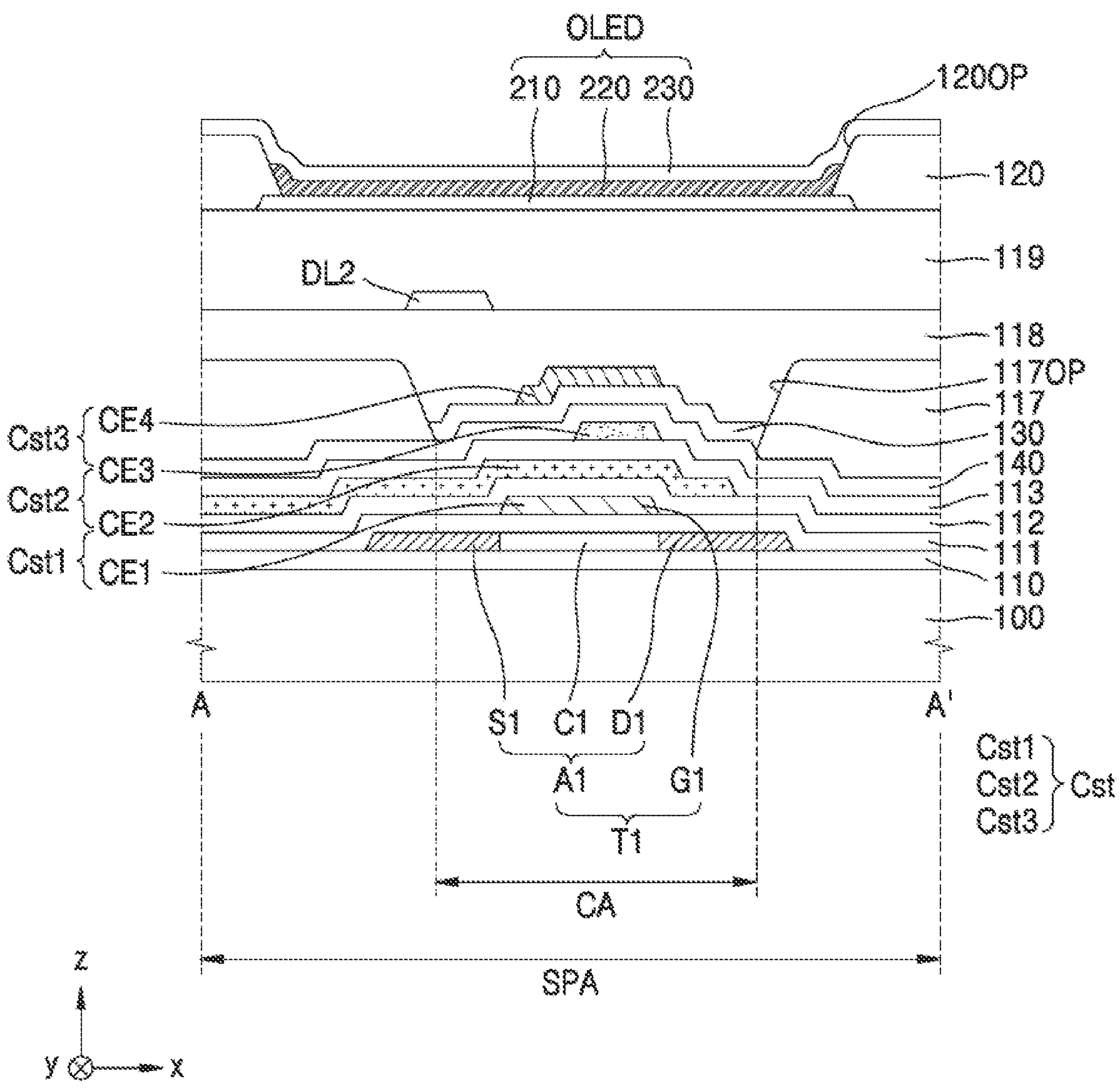
FIG. 8 is a schematic cross-sectional view of a display apparatus according to one or more other embodiments.

FIG. 8 is a modified example of FIG. 7 and a schematic cross-sectional view of a display apparatus, taken along the line A-A' FIG. 6. Hereinafter, a difference between FIGS. 7 and 8 is mainly described, and repeated descriptions are omitted.

Referring to FIG. 8, a first inorganic insulating layer 140 may be located on the second interlayer insulating layer 113 and the third capacitor electrode CE3. The first inorganic insulating layer 140 may include an inorganic insulating material, such as silicon oxide, silicon nitride, and/or silicon oxynitride, and may have a single-layer structure or a multilayered structure including the above material.

The first planarization layer 117 may be located on the first inorganic insulating layer 140. The first planarization layer 117 may include/define the opening 1170P corresponding to the capacitor area CA. The opening 1170P of the first planarization layer 117 may expose a portion of an upper surface of the first inorganic insulating layer 140 that covers the third capacitor electrode CE3.

The opening 1170P of the first planarization layer 117 may be filled with the inorganic insulating material 130. The inorganic insulating material 130 may cover the upper surface of the first inorganic insulating layer 140 exposed by the first planarization layer 117. The fourth capacitor electrode CE4 may be located on the inorganic insulating material 130.

The first inorganic insulating layer 140 and the inorganic insulating material 130 may be arranged between the third capacitor electrode CE3 and the fourth capacitor electrode CE4, and may function as a dielectric layer of the third capacitor Cst3.

Figure 9:
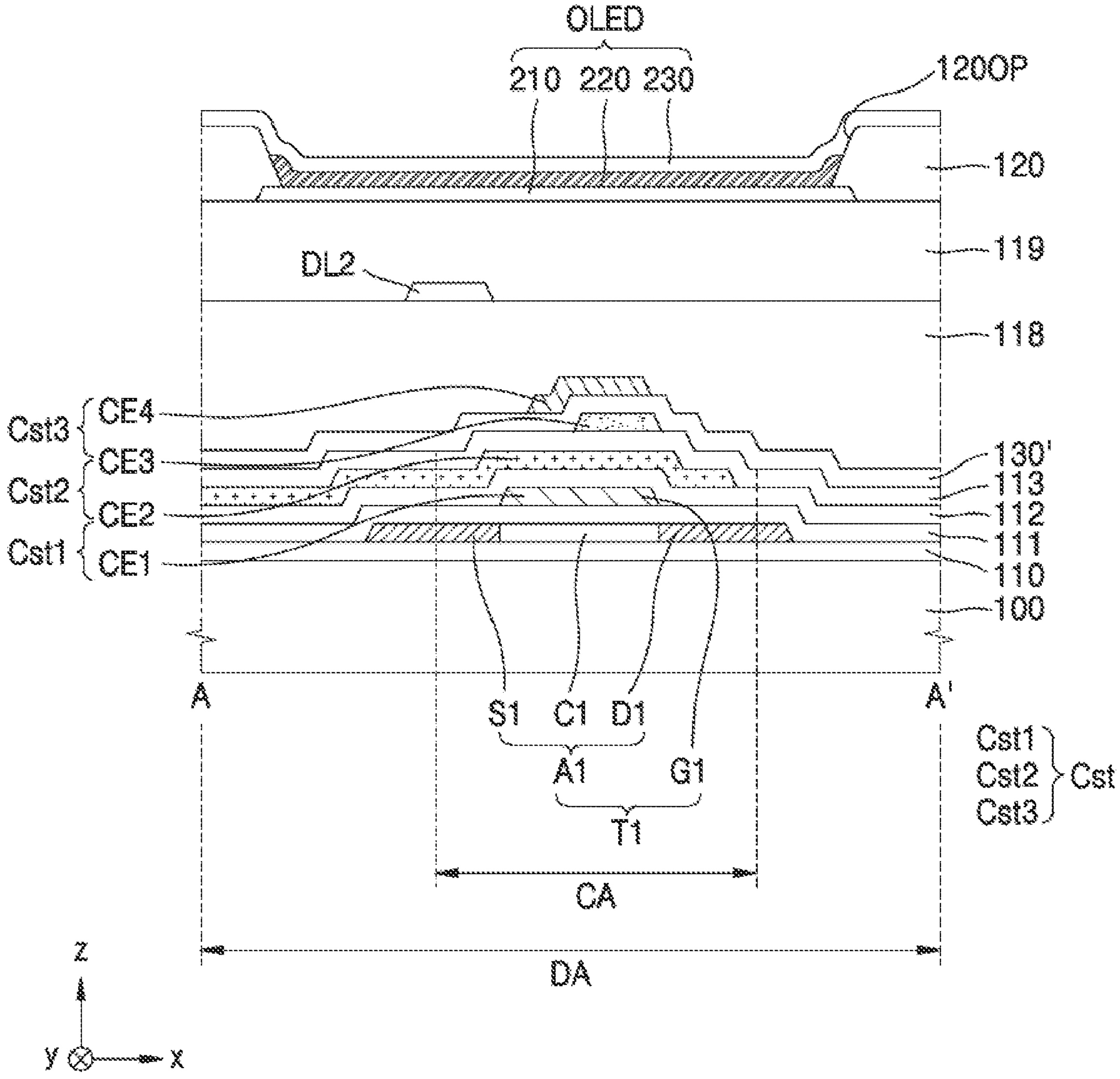
FIG. 9 is a schematic cross-sectional view of a display apparatus according to one or more other embodiments.

FIG. 9 is a schematic cross-sectional view of a display apparatus according to one or more other embodiments. Hereinafter, a difference between FIGS. 7 and 9 is mainly described, and repeated descriptions are omitted.

Referring to FIG. 9, in the entire display area DA, a second inorganic insulating layer 130' may be arranged on the second interlayer insulating layer 113 and the third capacitor electrode CE3. Unlike the illustration of FIG. 7, the display apparatus of FIG. 9 may omit a first planarization layer having/defining an opening. The fourth capacitor electrode CE4 may be arranged on the second inorganic insulating layer 130'. The fourth capacitor electrode CE4 may overlap the third capacitor electrode CE3 with the second inorganic insulating layer 130' therebetween. Therefore, the second inorganic insulating layer 130' may function as a dielectric layer of the third capacitor Cst3 including the third capacitor electrode CE3 and the fourth capacitor electrode CE4.

The second inorganic insulating layer 130' may be an inorganic insulating layer including an inorganic insulating material, such as silicon oxide, silicon nitride, and/or silicon oxynitride, and may have a single-layer structure or a multilayered structure including the above material.

The second planarization layer 118 may be arranged to cover the second inorganic insulating layer 130' and the fourth capacitor electrode CE4. The second data line DL2 may be located on the second planarization layer 118.

According to one or more embodiments, the second inorganic insulating layer 130', as opposed to the first planarization layer (117 of FIG. 7), may function as a dielectric layer of the third capacitor Cst3 formed by the third capacitor electrode CE3 and the fourth capacitor electrode CE4. Because a thickness of the second inorganic insulating layer 130' is relatively less than that of the first planarization layer (117 of FIG. 7), the capacitance of the third capacitor Cst3 may be improved. Therefore, a high-resolution display apparatus, in which the performance of a capacitor is improved as compared to a display apparatus having the same area, may be realized.

Figure 10:
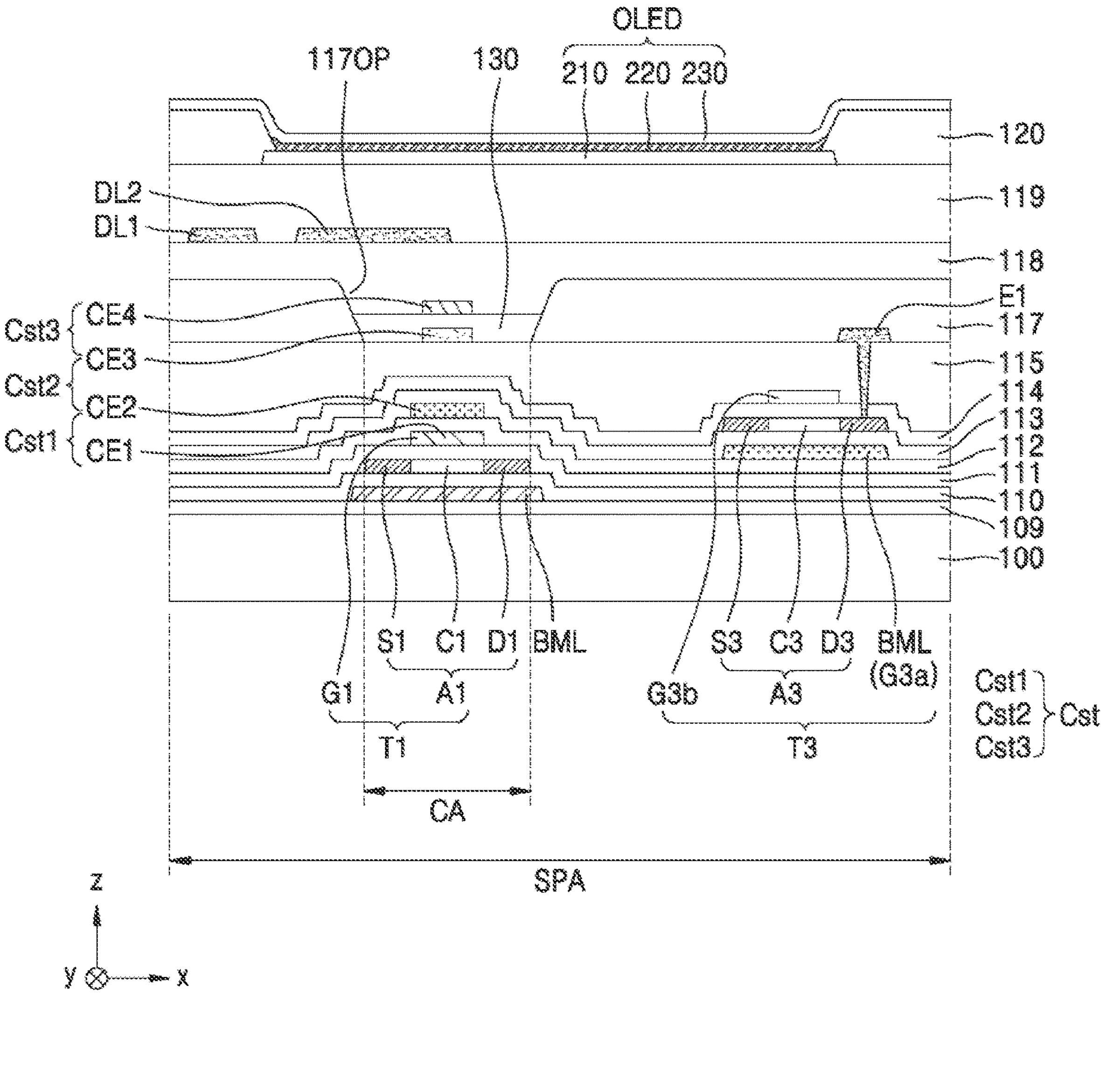
FIG. 10 is a schematic cross-sectional view of a display apparatus according to one or more other embodiments.

FIG. 10 is a schematic cross-sectional view of a display apparatus according to one or more other embodiments. The thin-film transistors of FIGS. 5 to 9 (e.g., the first thin-film transistor T1 to the seventh thin-film transistor T7), may all be silicon PMOS transistors, but in some embodiments, one or more of the thin-film transistors may each be an NMOS transistor. FIG. 10 shows the first thin-film transistor T1, which is the driving transistor, and the third thin-film transistor T3, which is the switching transistor, and the first thin-film transistor T1 may be a PMOS transistor, and the third thin-film transistor T3 may be an NMOS transistor.

A barrier layer 109 may be located on the substrate 100. The barrier layer 109 may prevent or decrease the penetration of impurities to a silicon semiconductor layer from the substrate 100, etc. The barrier layer 109 may include an inorganic material, such as oxide or nitride and/or an organic material, and may have a single-layer structure or a multilayered structure including organic and inorganic materials.

A lower conductive layer BML may be located on the barrier layer 109. The lower conductive layer BML may include one or more materials selected from among Al, Pt, Pd, Ag, Mg, Au, Ni, Nd, Ir, Cr, Li, Ca, Mo, Ti, W, and/or Cu, and may be one or more layers including the above material.

In one or more embodiments, the lower conductive layer BML may be located under the first semiconductor layer A1 of the first thin-film transistor T1, and may reduce or prevent the deterioration of characteristics of the first thin-film transistor T1 because of external light and/or electrical signals around the first thin-film transistor T1.

The buffer layer 110 may be located on the lower conductive layer BML. A silicon semiconductor layer (e.g., the first semiconductor layer A1), which includes amorphous silicon or polycrystalline silicon, may be located on the buffer layer 110. The first semiconductor layer A1 may include the first channel area Cl, and the first source area S1 and the first drain area D1 arranged on respective sides of the first channel area Cl.

The first gate-insulating layer 111 may be located on the first semiconductor layer A1. The first gate electrode G1 and the first capacitor electrode CE1 may be located on the first gate-insulating layer 111. In one or more embodiments, the first gate electrode G1 and the first capacitor electrode CE1 may be integrally formed. The first gate electrode G1 may perform functions of the first capacitor electrode CE1.

The first capacitor electrode CE1 may overlap at least a portion of the lower conductive layer BML. The first capacitor electrode CE1 and the lower conductive layer BML may form a capacitor with the buffer layer 110 and the first gate-insulating layer 111 therebetween.

The first interlayer insulating layer 112 may be arranged to cover the first gate electrode G1 and/or the first capacitor electrode CE1. The second capacitor electrode CE2 may be located on the second interlayer insulating layer 113. The second capacitor electrode CE2 may overlap at least a portion of the first capacitor electrode CE1. The second capacitor electrode CE2 may form the first capacitor Cst1 together with the first gate electrode G1 (or the first capacitor electrode CE1). Therefore, the first interlayer insulating layer 112 may be arranged between the first capacitor electrode CE1 and the second capacitor electrode CE2, and may function as a dielectric layer of the first capacitor Cst1.

The second interlayer insulating layer 113 may be located on the second capacitor electrode CE2. An oxide semiconductor layer may be located on the second interlayer insulating layer 113. In relation to this, FIG. 10 shows a third semiconductor layer A3 of the third thin-film transistor T3. The third semiconductor layer A3 may include a third channel area C3, and may also include conductive areas (e.g., a third source area S3 and a third drain area D3), which are arranged on respective sides of the third channel area C3.

A third gate electrode G3 may be located under and/or on the third semiconductor layer A3. In one or more embodiments, FIG. 10 shows that the third gate electrode G3 includes a third lower gate electrode G3*a* located under the third semiconductor layer A3, and a third upper gate electrode G3*b* located on the third semiconductor layer A3. In some embodiments, any one of the third lower gate electrode G3*a* and the third upper gate electrode G3*b* may be omitted.

The third lower gate electrode G3*a* may include the same material as, and may be arranged on the same layer (e.g., the first interlayer insulating layer 112) as, the second capacitor electrode CE2.

The third upper gate electrode G3*b* may be arranged on the third semiconductor layer A3 with the second gate-insulating layer 114 therebetween. The third upper gate electrode G3*b* may include Al, Pt, Pd, Ag, Mg, Au, Ni, Nd, Ir, Cr, Li, Ca, Mo, Ti, W, Cu, and/or the like, and may be one or more layers including the above material.

FIG. 10 shows that the second gate-insulating layer 114 is arranged to entirely cover the substrate 100 like other insulating layers (e.g., the buffer layer 110), but the present disclosure is not limited thereto. In some embodiments, the second gate-insulating layer 114 may only be arranged between the third upper gate electrode G3*b* and the third semiconductor layer A3. The second gate-insulating layer 114 may be an inorganic insulating layer including an inorganic insulating material, such as silicon oxide, silicon nitride, and/or silicon oxynitride, and may have a single-layer structure or a multilayered structure including the above material.

A third interlayer insulating layer 115 may be arranged on the third upper gate electrode G3*b*. The third interlayer insulating layer 115 may be an inorganic insulating layer including an inorganic insulating material, such as silicon oxide, silicon nitride, and/or silicon oxynitride, and may have a single-layer structure or a multilayered structure including the above material.

A first electrode E1 may include the same material as, and may be located on the same layer (e.g., the third interlayer insulating layer 115) as, the third capacitor electrode CE3.

The first electrode E1 may include Al, Pt, Pd, Ag, Mg, Au, Ni, Nd, Ir, Cr, Li, Ca, Mo, Ti, W, Cu, and/or the like, and may be one or more layers including the above material.

The first electrode E1 may be electrically connected to the third source area S3 or the third drain area D3 of the third semiconductor layer A3 through a contact hole penetrating the third interlayer insulating layer 115 and the second gate-insulating layer 114. For example, the first electrode E1 may be electrically connected to the third drain area D3.

The third capacitor electrode CE3 may be located on the third interlayer insulating layer 115. The third capacitor electrode CE3 may overlap at least a portion of the second capacitor electrode CE2. The third capacitor electrode CE3 may form the second capacitor Cst2 together with the second capacitor electrode CE2. The second interlayer insulating layer 113, the second gate-insulating layer 114, and the third interlayer insulating layer 115, which are arranged between the second capacitor electrode CE2 and the third capacitor electrode CE3, may each function as a dielectric layer of the second capacitor Cst2.

In one or more embodiments, the first planarization layer 117 may be located on the third interlayer insulating layer 115. The first planarization layer 117 may include/define the opening 1170P corresponding to the capacitor area CA. The opening 1170P of the first planarization layer 117 may expose the third capacitor electrode CE3 of the capacitor Cst and a portion of an upper surface of the third interlayer insulating layer 115.

The opening 1170P of the first planarization layer 117 may be filled with an inorganic insulating material 130. The inorganic insulating material 130 may cover the upper surface of the third interlayer insulating layer 115 and a portion of a side surface of the opening 1170P that are exposed by the opening 1170P of the first planarization layer 117.

The fourth capacitor electrode CE4 may be located on the inorganic insulating material 130. The fourth capacitor electrode CE4 may overlap at least a portion of the third capacitor electrode CE3. The fourth capacitor electrode CE3 may form the third capacitor Cst3 together with the third capacitor electrode CE3. Therefore, the inorganic insulating material 130 arranged in the opening 1170P of the first planarization layer 117 may be arranged between the fourth capacitor electrode CE4 and the third capacitor electrode CE3 to function as a dielectric layer of the second capacitor Cst2.

In one or more embodiments, the thickness of the inorganic insulating material 130 arranged in the opening 1170P of the first planarization layer 117 may be less than the thickness of the first planarization layer 117.

In one or more embodiments, the first capacitor electrode CE1 and the third capacitor electrode CE3 of the capacitor Cst may be electrically connected to the lower conductive layer BML. For example, the first capacitor electrode CE1 may be electrically connected to the lower conductive layer BML through a contact hole penetrating the first gate-insulating layer 111 and the buffer layer 110. Also, the third capacitor electrode CE3 may be electrically connected to the first capacitor electrode CE1, and thus may be electrically connected to the lower conductive layer BML through the first capacitor electrode CE1.

Also, the fourth capacitor electrode CE4 of the capacitor Cst is electrically connected to the second capacitor electrode CE2. For example, the fourth capacitor electrode CE4 may be electrically connected to the second capacitor electrode CE2 through a contact hole penetrating the inorganic insulating material 130 or the first planarization layer 117, the second interlayer insulating layer 113, the second gate-insulating layer 114, and the third interlayer insulating layer 115. In other words, the capacitor Cst may have a structure in which a capacitor formed by the first capacitor electrode CE1 and the lower conductive layer BML, the first capacitor Cst1, the second capacitor Cst2, and the third capacitor Cst3 are connected in parallel.

According to one or more embodiments, a high-resolution display apparatus, in which the performance of a capacitor, may be realized. However, the scope of the disclosure is not limited by the effects.

It should be understood that embodiments described herein should be considered in a descriptive sense only and not for purposes of limitation. Descriptions of aspects within each embodiment should typically be considered as available for other similar aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display apparatus comprising:
a substrate comprising a sub-pixel area;
a first thin-film transistor in the sub-pixel area, and comprising a first semiconductor layer, and a first gate electrode overlapping the first semiconductor layer with a gate-insulating layer therebetween; and
a capacitor in the sub-pixel area, electrically connected to the first thin-film transistor, and comprising:
a first electrode comprising a same material as the first gate electrode;
a second electrode overlapping the first electrode with a first inorganic insulating layer therebetween;
a third electrode overlapping the second electrode with a second inorganic insulating layer therebetween; and
a fourth electrode overlapping the third electrode with an insulating layer therebetween, the insulating layer being above the second inorganic insulating layer and comprising a first organic insulating layer defining an opening corresponding to the capacitor and filled with an inorganic insulating material.

2. The display apparatus of claim 1, wherein the opening of the first organic insulating layer exposes the third electrode of the capacitor.

3. The display apparatus of claim 1, wherein the fourth electrode of the capacitor is above the inorganic insulating material.

4. The display apparatus of claim 1, wherein a thickness of the inorganic insulating material in the opening of the first organic insulating layer is less than a thickness of the first organic insulating layer.

5. The display apparatus of claim 1, wherein the first electrode of the capacitor is integrally formed with the first gate electrode.

6. The display apparatus of claim 1, wherein the first semiconductor layer comprises a channel area overlapping the first gate electrode, and a source area and a drain area at respective sides of the channel area, wherein the display apparatus further comprises an electrode electrically connected to one of the source area or the drain area, and wherein the third electrode of the capacitor comprises a same material as the electrode.

7. The display apparatus of claim 1, wherein the insulating layer is between the second inorganic insulating layer and the first organic insulating layer, and further comprises a third inorganic insulating layer covering the third electrode of the capacitor.

8. The display apparatus of claim 7, wherein the opening of the first organic insulating layer exposes an upper surface of the third inorganic insulating layer.

9. The display apparatus of claim 1, wherein the opening of the first organic insulating layer corresponds to the sub-pixel area.

10. The display apparatus of claim 1, further comprising a second thin-film transistor in the sub-pixel area, and comprising a second semiconductor layer, and a second gate electrode overlapping the second semiconductor layer, wherein the first semiconductor layer comprises a silicon semiconductor, and wherein the second semiconductor layer comprises an oxide semiconductor.

11. The display apparatus of claim 1, wherein the third electrode of the capacitor is electrically connected to the first electrode of the capacitor, and wherein the fourth electrode of the capacitor is electrically connected to the second electrode of the capacitor.

12. The display apparatus of claim 1, further comprising a first conductive layer under the first semiconductor layer, and overlapping the first semiconductor layer and the first gate electrode with an inorganic insulating layer therebetween.

13. The display apparatus of claim 12, wherein the first conductive layer is electrically connected to the second electrode and the fourth electrode of the capacitor.

14. A display apparatus comprising:

a substrate comprising a display area comprising pixels;

a first thin-film transistor comprising a first semiconductor layer, and a first gate electrode overlapping the first semiconductor layer with a gate-insulating layer therebetween; and a capacitor electrically connected to the first thin-film transistor, and comprising:

a first electrode comprising a same material as the first gate electrode;

a second electrode overlapping the first electrode with a first inorganic insulating layer therebetween;

a third electrode overlapping the second electrode with a second inorganic insulating layer therebetween; and a fourth electrode overlapping the third electrode with a third inorganic insulating layer therebetween, the third and fourth electrodes overlapping the first semiconductor layer.

15. The display apparatus of claim 14, further comprising:

a first data line extending in a first direction, and connected to one of a sub-pixel in an odd row or a sub-pixel in an even row; and a second data line apart from the first data line, at a same layer as the first data line, extending in the first direction, and connected to an other of the sub-pixel in the odd row and the sub-pixel in the even row.

16. The display apparatus of claim 14, wherein the first semiconductor layer comprises a channel area overlapping the first gate electrode, and a source area and a drain area at respective sides of the channel area, wherein the display apparatus further comprises an electrode electrically connected to one of the source area or the drain area, and wherein the third electrode of the capacitor comprises a same material as the electrode.

17. The display apparatus of claim 14, further comprising a second thin-film transistor comprising a second semiconductor layer and a second gate electrode, wherein the first semiconductor layer comprises a silicon semiconductor, and wherein the second semiconductor layer comprises an oxide semiconductor.

18. The display apparatus of claim 14, wherein the third electrode of the capacitor is electrically connected to the first electrode of the capacitor, and wherein the fourth electrode of the capacitor is electrically connected to the second electrode of the capacitor.

19. The display apparatus of claim 14, further comprising a first conductive layer under the first semiconductor layer, and overlapping the first semiconductor layer and the first gate electrode.

20. A display apparatus comprising:

a substrate comprising a display area comprising pixels;

a first thin-film transistor comprising a first semiconductor layer, and a first gate electrode overlapping the first semiconductor layer with a gate-insulating layer therebetween; and a capacitor electrically connected to the first thin-film transistor, and comprising:

a first electrode comprising a same material as the first gate electrode;

a second electrode overlapping the first electrode with a first inorganic insulating layer therebetween;

a third electrode overlapping the second electrode with a second inorganic insulating layer therebetween:

a fourth electrode overlapping the third electrode with a third inorganic insulating layer therebetween; and a first conductive layer under the first semiconductor layer, and overlapping the first semiconductor layer and the first gate electrode, wherein the first conductive layer is electrically connected to the second electrode and the fourth electrode of the capacitor.

* * * * *